(12) United States Patent
Chen et al.

(10) Patent No.: US 6,276,295 B1
(45) Date of Patent: Aug. 21, 2001

(54) THERMAL REFLOW METHOD EMPLOYING MICROWAVE ENERGY

(75) Inventors: Ling Chen; Steven T. Li, both of Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 08/903,494

(22) Filed: Jul. 30, 1997

(51) Int. Cl.[7] .................................................. H01L 21/31
(52) U.S. Cl. ............................... 118/723 MW; 118/725; 427/457; 427/561; 438/760; 438/795
(58) Field of Search ................................... 118/723 MW, 118/723 ME, 723 MR, 724, 725; 156/345; 219/745, 746, 759, 695; 438/759, 760, 761, 763, 795, 796, 797; 427/457, 458, 461, 471, 540, 561

(56) References Cited

U.S. PATENT DOCUMENTS

| | | | |
|---|---|---|---|
| 4,792,772 | 12/1988 | Asmussen | 333/230 |
| 5,191,182 | * 3/1993 | Gelorme et al. | 219/696 |
| 5,311,103 | 5/1994 | Asmussen et al. | 315/111.81 |
| 5,406,056 | 4/1995 | Hawley et al. | 219/693 |
| 5,512,512 | * 4/1996 | Isobe | 438/646 |

OTHER PUBLICATIONS

Ruth A Brain, "Capillary–Driven Reflow of thin Cu Films with Submicron, High Aspect Ration Features", California Institute of Technology, pp. 1–168, (1996).*

Y. Sun, et al. "Low–Temperature Laser Reflow of Copper for Interconnections in Integrated Circuits," 1996 VMIC Conference, pp. 493–497, Jun. 1996.

Ruth A. Brain, "Capillary–Driven Reflow of Thin Cu Films with Submicron, High Aspect Ratio Features," *California Institute of Technology, Pasadena, CA, Thesis by Ruth A. Brain,* pp. 1–168, (1996).

* cited by examiner

*Primary Examiner*—Nam Nguyen
*Assistant Examiner*—Thu Khanh T. Nguyen
(74) *Attorney, Agent, or Firm*—Townsend and Townsend and Crew LLP

(57) ABSTRACT

A thermal reflow system and method employing microwave energy to reduce the time required to achieve thermal reflow of a metal thin-film layer disposed on a semiconductor substrate at reduced temperatures while maintaining good gap-filling properties. The system includes a process chamber designed as a high-Q resonant cavity for microwave energy. The substrate is supported within the chamber on an electrically non-conductive susceptor which allows movement therein to redefine the boundary conditions of the electromagnetic fields associated with the microwave energy. To prevent plasma formation or arcing in the chamber, the chamber is evacuated. This also reduces thermal transfer between the metal thin-film layer and the substrate via convection. Rapidly cooling is achieved, subsequent to the reflow of the metal thin-film layer, by pressurizing the chamber. This allows maximizing the amount of microwave energy that may be absorbed by the metal thin-film in a given period of time without substantially heating the underlying substrate.

24 Claims, 6 Drawing Sheets

THERMAL REFLOW METHOD EMPLOYING MICROWAVE ENERGY

BACKGROUND OF THE INVENTION

The present invention relates to the processing of semiconductor wafers. More particularly, the present invention relates to a thermal reflow technique that reduces the time necessary for reflow of a gap-filling metal thin-film without substantially heating the substrate underlying the metal thin-film. The present invention is particularly useful for the reflow of metallization layers deposited using conventional semiconductor processing methods.

BACKGROUND OF THE INVENTION

Thin-films are widely used to fabricate various electronic, optical and magnetic structures, because the processing of the thin-films may be precisely controlled allowing the manufacture of complex components. These films are typically thermally grown or deposited from a vapor phase. Often the films are formed from metals, semiconductors or insulator and must satisfy rigorous chemical, structural and electrical requirements. Patterned conductors and dielectric layers typically produce stepped topography. It is difficult to deposit films over stepped topography while avoiding defects in the same, such as voids in the dielectrics and opens in metal interconnect layers. Such defects may result in a reduction in production yields due to, inter alia, shorts between adjacent interconnect lines. To avoid these problems planarization techniques are implemented to reduce topographic undulations produced by the patterned metallization and dielectric layers.

Thermal reflow is a well known planarization technique in which the temperature of a metal thin-film layer is raised sufficiently to achieve diffusion of the metal atoms that comprise the metal thin-film layer. While in the diffusion state, the metal atoms of the thin-film layer flow so as to achieve equilibrium, filling all gaps and voids of the underlying layer and providing a substantially smooth surface. Thermal reflow is achieved by employing a conventional furnace to raise the temperature of both the metal thin-film layer and the underlying substrate. This requires a substantially longer process time than would be the case if only the metal thin-film layer were heated, due to the heating of the additional mass of the substrate. The structural integrity of the substrate may be compromised, resulting from exposure to the high temperatures necessitated to reach the melting-point of the metal thin-film.

Partial thermal isolation of the substrate during a thermal reflow technique has been achieved by employing lasers. For example, excimer lasers, such as an XeCl laser producing 308 nm wavelength beam, are used in thermal reflow of alumina layers. The laser is pulsed and the process is carried out in a vacuum chamber evacuated to approximately $7.5 \times 10^{-7}$ torr, with the substrate being maintained in the range of 250 to 450° C. It is necessary to provide a sufficient amount of laser energy to prevent boundary separation and metal cracking. To that end, the laser impinges upon the substrate surface as a localized spot which is scanned across the entire surface to achieve thermal reflow. Such a scanning process increases the time necessary to reflow the metal thin-film.

Recently developed is another thermal reflow technique which partially isolates, thermally, a substrate from the energy employed to heat a metal thin-film disposed thereon. This technique involves the use of microwave energy to reflow a copper thin-film disposed on a silicon substrate which is approximately 3 mm in diameter. See Ruth A. Brain, "Capillary-Driven Reflow of Thin Cu Films with Submicron, High Aspect Ratio Features", Doctoral Thesis Submitted to the California Institute of Technology, Pasadena, Calif., pp. 102–113 (1995). As described therein, recesses in a $SiO_2$ substrate, having aspect ratios of up to 2.5:1, were filled with a copper thin-film without substantial thermal radiation reaching the substrate. Id. at page 113. This necessitated pulsing a microwave field at an appropriate duty cycle to prevent overheating of the substrate, thereby increasing the time required to achieve planarization. See id. The process disclosed, however, is not practical for fabrication of standard-size substrates which are typically greater than one hundred millimeters in diameter.

What is needed, therefore, is a thermal reflow technique that allows rapid diffusion of a metal thin-film so as to fill the steps on the surface of a standard-size substrate, of the type typically measuring at least one hundred millimeters in diameter, without substantially heating the substrate.

SUMMARY OF THE INVENTION

The present invention provides a thermal reflow system and method to achieve thermal reflow of a metal thin-film layer disposed on a semiconductor substrate so as to fill the gaps present therein, without substantially heating the substrate. The present invention does so by providing a process chamber designed as a high-Q resonant cavity for microwave energy, defining a reflow chamber. The microwave energy present in the reflow chamber rapidly heats the metal thin-film layer sufficiently to cause diffusion of the metal atoms present in the thin-film layer. Rapid heating is achieved by maximizing the mount of microwave energy absorbed by the metal thin-film layer. To that end, the substrate is supported within the chamber on an electrically non-conductive susceptor which is adapted to move within the cavity, and the atmospheric pressure of the reflow chamber is controlled to prevent a plasma from being formed in the reflow chamber.

The thermal reflow system includes a reflow chamber having conductive walls, defining a resonant cavity; a source of microwave energy; and a waveguide. A susceptor is formed from a dielectric and disposed within the cavity to support a substrate. The waveguide is coupled between the cavity and the source of microwave energy so as to allow the microwave energy to enter the cavity in a region thereof, defining an input aperture, disposed opposite to the susceptor. The spatial relationship between the region and the susceptor is chosen so that the susceptor is centrally disposed with respect to electric fields of the microwave energy. To maximize the energy absorbed by the substrate per unit time, the susceptor is moveably disposed within the cavity to move transverse to the electric fields and vary the distance between the substrate and the input aperture. Additionally, the pressure within the reflow chamber is established to prevent unwanted dissipation of the microwave energy due to, e.g., plasma formation and/or arcing. After reflow of the metal thin-film layer is achieved, the pressure in the reflow chamber is increased to rapidly cool the metal thin-film layer and the substrate. In this fashion, the temperature of the substrate is maintained below a predetermined temperature to prevent the compromise of the substrate's structural integrity. To further reduce the time necessary to heat the metal thin-film on the substrate, the susceptor may be placed in thermal communication with a heater so that it may be heated, provided that the temperature to which it is heated does not degrade the structural integrity of the substrate.

The method in accordance with the present invention includes the steps of evacuating the reflow chamber;

introducing, into the processing chamber, microwave energy having a predetermined frequency at a region disposed opposite to the substrate; isolating, electromagnetically, the susceptor from the chamber walls; adjusting a distance between the substrate and the region to maximize absorption of the microwave energy absorbed by the metal thin-film; and maintaining process conditions, proximate to the surface of the substrate, for a predetermined amount of time to allow the metal thin-film. In one embodiment, the step of evacuating the reflow chamber takes place subsequent to the step of placing the substrate in the reflow chamber to reflow over the surface. Finally, a heating step may be included in which the susceptor is heated to reduce the time necessary to reflow the metal thin-film.

DETAILED DESCRIPTION OF THE SPECIFIC EMBODIMENTS

I. Introduction

The present invention allows accelerated thermal reflow of metal thin-films to provide excellent gap-filling properties which reduces the heating of a substrate underlying the metal thin-films. Metal thin-films subjected to the thermal reflow technique according to the present invention may be heated in less than thirty seconds to achieve 100% gap fill for topography having a high aspect ratio.

II. Exemplary Processing System

Figure 1:
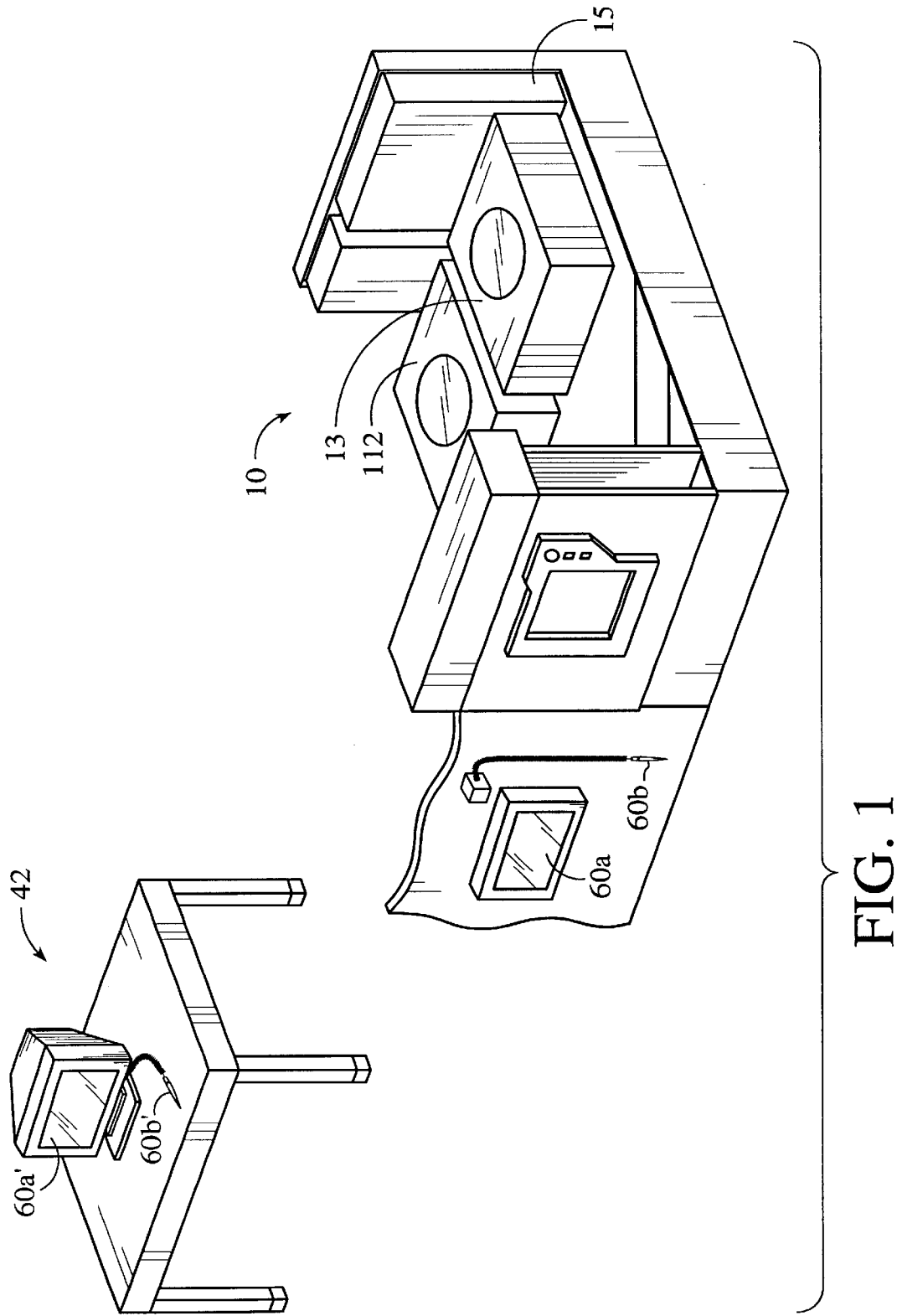
FIG. 1 is a simplified diagram of multi-chamber vacuum processing system, in accord with the present invention.

FIG. 1 illustrates an exemplary multi-chamber vacuum processing system 10 which includes a parallel plate, cold-wall chemical vapor deposition system 13 and thermal reflow system 12 disposed in a central transfer chamber 15, which is typically serviced by a robot (not shown). The processing system 10 includes a system controller 42 which is interfaced with a user via a CRT monitor 60a and light pen 60b, keyboard, mouse, or other pointing or data input device. Preferably, two monitors 60a, 60a' are employed, one mounted in system wall for the operators and the other behind the wall for the service technicians.

III. Exemplary CVD Reactor Chamber

Figure 2:
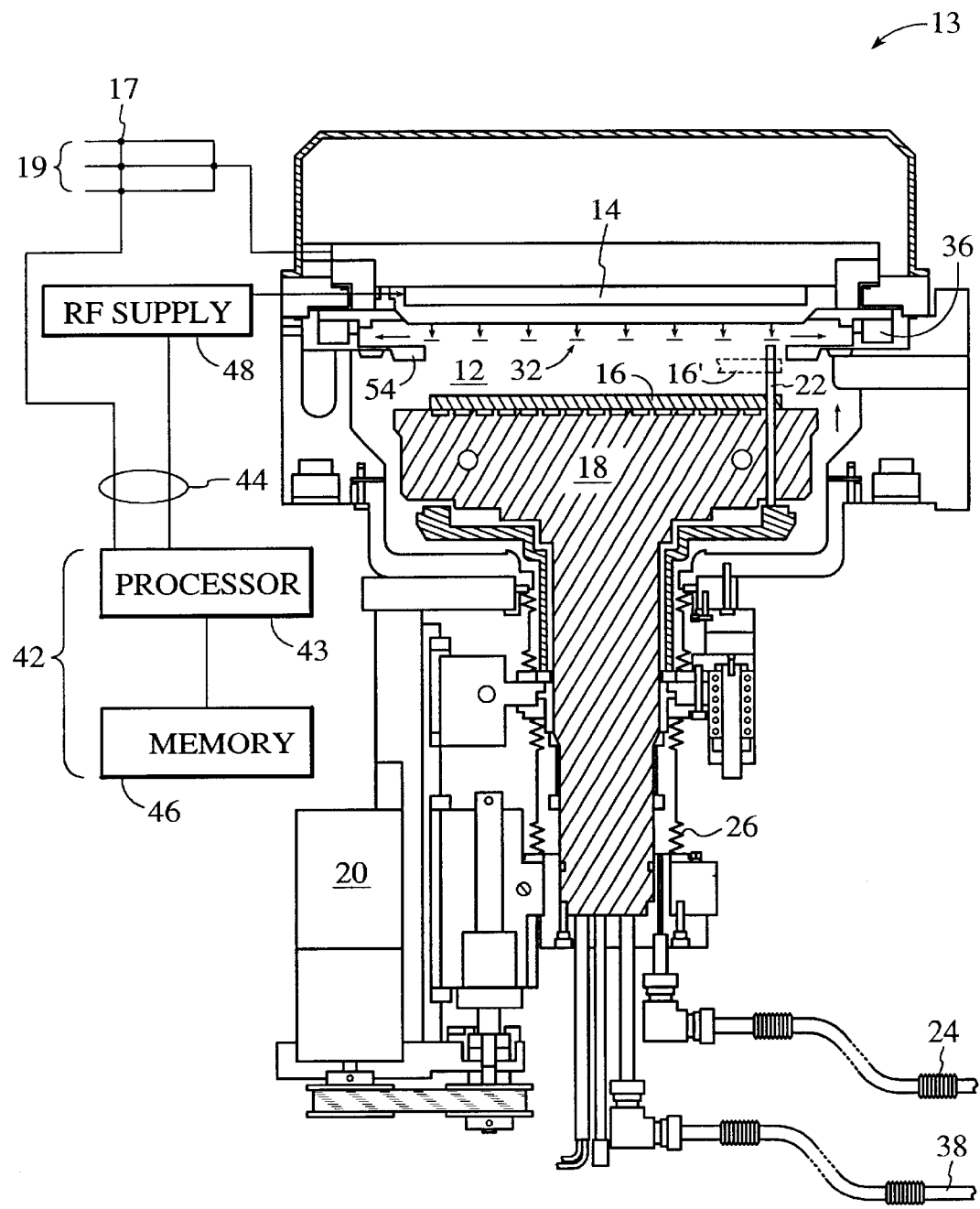
FIG. 2 is a vertical, cross-sectional view of one embodiment of a simplified chemical vapor deposition apparatus according to the present invention.
Figure 3:
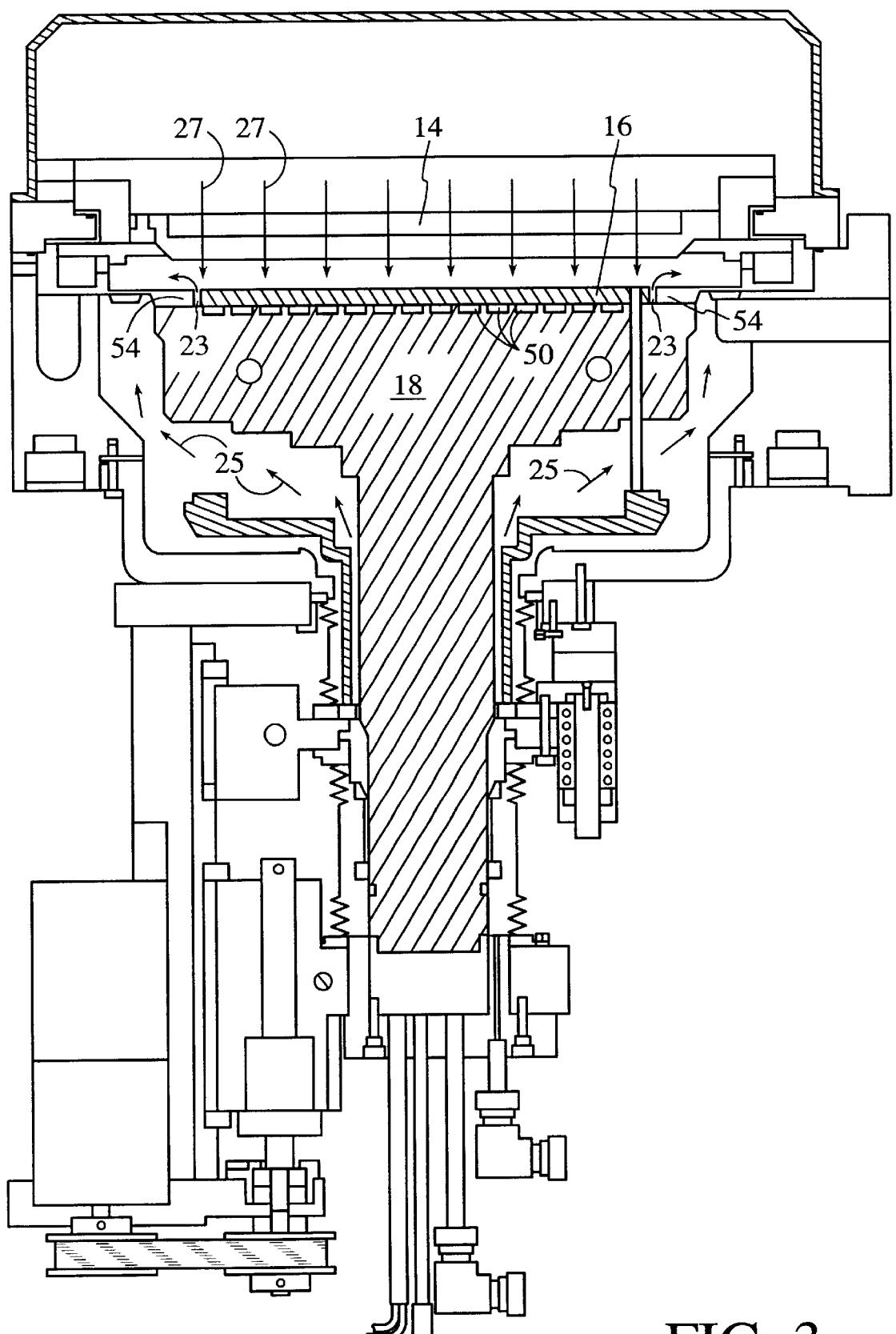
FIG. 3 is a vertical, cross-sectional view of one embodiment of a resistively heated susceptor used in the chamber of FIG. 2 to secure a substrate being processed in chamber.

Referring to FIGS. 1, 2 and 3, a substrate 16 may be brought into the chamber 12 of the system 13 by a robot blade through a slit valve in a sidewall of the chamber (not shown). The chamber 12 includes a gas distribution manifold 14 for dispersing deposition gases to the substrate 16 resting on a resistively-heated susceptor 18. Susceptor 18 is moveable vertically by means of a motor 20. Substrate 16 is brought into the chamber when susceptor 18 is in a first position opposite the slit valve as shown in FIG. 2. At the first position, substrate 16 is supported initially by a set of pins 22 that pass through and are coupled to susceptor 18. Pins 22 are driven by a single motor assembly. As the susceptor 18 is brought to a processing position 32 opposite gas distribution manifold 14, pins 22 sink into susceptor 18, with the substrate 16 becoming supported by the susceptor. Once positioned on susceptor 18, substrate 16 is affixed to the susceptor by a vacuum clamping system, shown more clearly in FIG. 3 as grooves 50.

Upon moving upward toward processing position 32, the substrate 16 contacts purge guide 54, which centers the substrate 16 on the susceptor 18. Edge purge gases 23 are flowed through purge guides 54 across the edge of substrate 16 to prevent deposition gases from contacting the edge and backside of the substrate. Purge gases 25 are also flowed around heater/susceptor 18 to minimize deposition on an around the heater/susceptor. These purge gases 25 are supplied from a purge line (FIG. 2, 24) and are also employed to protect stainless steel bellows 26 from damage by corrosive gases introduced into the chamber during processing.

Deposition and carrier gases are supplied to a deposition zone of the chamber through gas lines 19 to manifold 14 in response to the control of valves 17. During processing, gas supplied to manifold 14 is distributed uniformly across the surface of the substrate as shown by arrows 27. Spent processing gases and by-product gases are exhausted from the chamber by means of exhaust system 36. The rate at which gases are released through exhaust system 36 into an exhaust line is controlled by a throttle valve (not shown). During deposition, a second purge gas through gas channels in the susceptor (not shown) and feed line 38 feeds purge gas against the edge of wafer 16 as previously described. An RF power supply 48 can be coupled to manifold 14 to provide for plasma-enhanced CVD (PECVD) cleaning of the chamber.

A system controller 42 regulates all of the activities of the CVD machine, such as the throttle valve, gas supply valves 17, motor 20, resistive heater coupled to susceptor 18, RF power supply 48, over control lines 44 (only some of which are shown). The system controller 42 includes a processor 43 that operates under the control of a computer program stored in a computer-readable medium such as a memory 146. The computer program dictates the temperature, chamber pressure, timing, mixture of gases, RF power levels, susceptor position, and other parameters of a particular process. In a preferred embodiment, the memory 146 may include a hard disk drive (not shown), a floppy disk drive (not shown) and a system controller 42. The system controller 42 may contain a single-board computer (SBC), analog and digital input/output boards, interface boards and stepper motor controller boards. Various parts of CVD system 10 conform to the Versa Modular European (VME) standard which defines board, card cage, and connector dimensions and types. The VME standard also defines the bus structure as having a 16-bit data bus and a 24-bit address bus.

The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate the system controller 42.

As discussed above, the interface between a user and the system controller 42 is via the CRT monitor 60a and a data input device, such as the light pen 60b. The monitors 60a and 60a' simultaneously display the same information, but only one light pen 60b is enabled. a light sensor in the tip of light pen 60b detects light emitted by CRT display. To select a particular screen or function, the operator touches a designated area of the display screen and pushes the button on the pen 60b. The touched area changes its highlighted color, or a new menu or screen is displayed, confirming communication between the light pen and the display screen. Other devices, such as a keyboard, mouse, or other pointing or communication device, may be used instead of or in addition to light pen 60b to allow the user to communicate with controller 42.

The process for depositing the film can be implemented using a computer program product that is executed by the system controller 42. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The processor then reads and executes the code to perform the tasks identified in the program.

Figure 4:
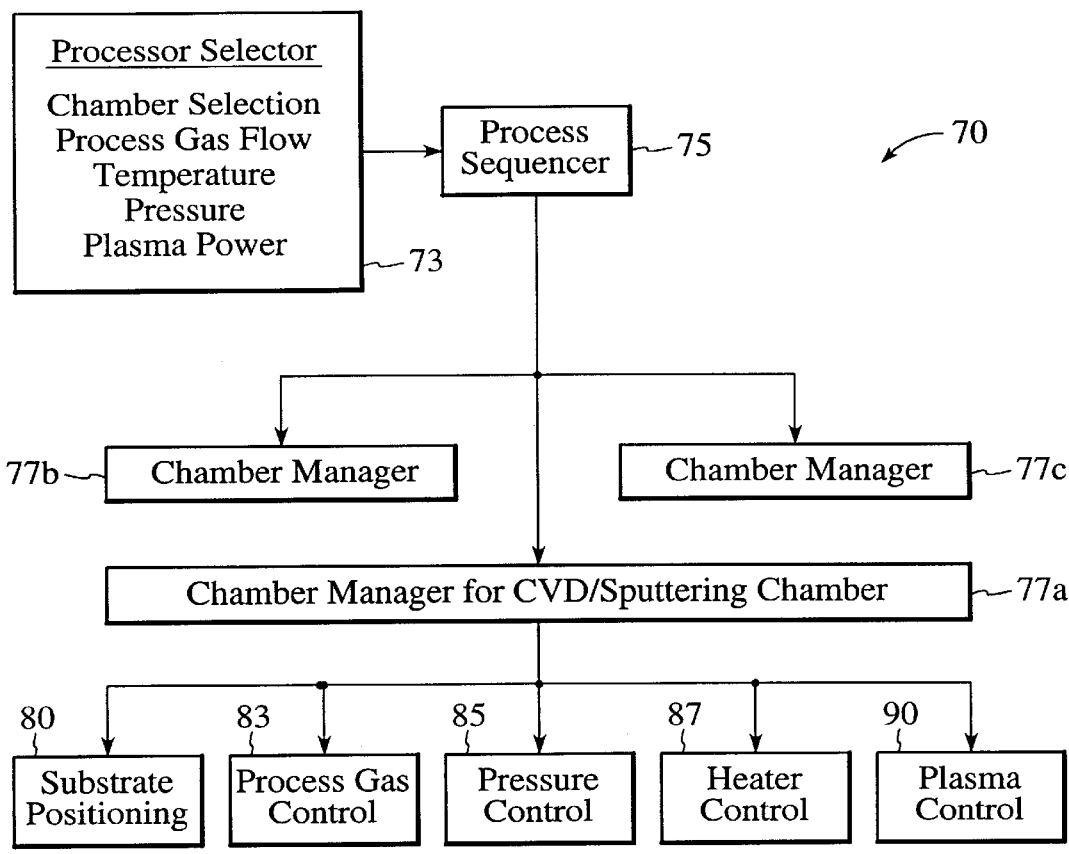
FIG. 4 is a block diagram of the hierarchical control structure of the system control software, computer program, according to a specific embodiment.
Figure 6:
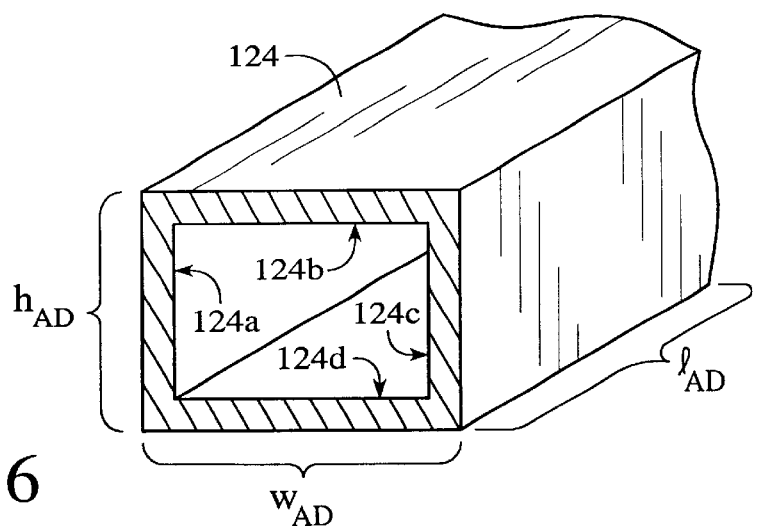
FIG. 6 is a cross-sectional perspective view of a waveguide shown in FIG. 5.

Referring to FIG. 4, shown is a block diagram of the hierarchical control structure of the system control software, computer program 70, according to a specific embodiment. Using the light pen interface, a user enters a process set number and process chamber number into a process selector subroutine 73 in response to menus or screens displayed on the CRT monitor. The process sets are predetermined sets of process parameters necessary to carry out specified processes, and are identified by predefined set numbers. The process selector subroutine 73 identifies (i) the desired process chamber and (ii) the desired set of process parameters needed to operate the process chamber for performing the desired process. The process parameters for performing a specific process relate to process conditions such as, for example, process gas composition and flow rates, temperature, pressure, plasma conditions such as RF power levels and the low frequency RF frequency, cooling gas pressure, and chamber wall temperature. These parameters are provided to the user in the form of a recipe, and are entered utilizing the light pen/CRT monitor interface. The signals for monitoring the process are provided by the analog and digital input boards of the system controller, and the signals for controlling the process are output on the analog and digital output boards of CVD system 10.

A process sequencer subroutine 75 comprises program code for accepting the identified process chamber and set of process parameters from the process selector subroutine 73, and for controlling operation of the various process chambers. Multiple users can enter process set numbers and process chamber numbers, or a user can enter multiple process set numbers and process chamber numbers, so the sequencer subroutine 75 operates to schedule the selected processes in the desired sequence. Preferably, the sequencer subroutine 75 includes a program code to perform the steps of (i) monitoring the operation of the process chambers to determine if the chambers are being used, (ii) determining what processes are being carried out in the chambers being used, and (iii) executing the desired process based on availability of a process chamber and type of process to be carried out. Conventional methods of monitoring the process chambers can be used, such as polling. When scheduling which process is to be executed, the process sequencer subroutine 75 takes into consideration the present condition of the process chamber being used in comparison with the desired process conditions for a selected process, or the "age" of each particular user entered request, or any other relevant factor a system programmer desires to include for determining scheduling priorities.

Once the sequencer subroutine 75 determines which process chamber and process set combination is going to be executed next, the process sequencer subroutine 75 initiates execution of the process set by passing the particular process set parameters to a chamber manager subroutine 77a–c, which controls multiple processing tasks in the process chamber 12 according to the process set determined by the process sequencer subroutine 75. For example, the chamber manager subroutine 77a comprises program code for controlling sputtering and CVD process operations in the process chamber 12. The chamber manager subroutine 77 also controls execution of various chamber component subroutines that control operation of the chamber components necessary to carry out the selected process set. Examples of chamber component subroutines are substrate positioning subroutine 80, process gas control subroutine 83, pressure control subroutine 85, heater control subroutine 87 and plasma control subroutine 90, in some embodiments. a person having ordinary skill in the art will readily recognize that other chamber control subroutines can be included depending on what processes are to be performed in the process chamber 12. In operation, the chamber manager subroutine 77a selectively schedules or calls the process component subroutines in accordance with the particular process set being executed. The chamber manager subroutine 77a schedules the process component subroutines much like the sequencer subroutine 75 schedules which process chamber 12 and process set are to be executed next. Typically, the chamber manager subroutine 77a includes steps of monitoring the various chamber components, determining which components need to be operated based on the process parameters for the process set to be executed, and causing execution of a chamber component subroutine responsive to the monitoring and determining steps.

Operation of particular chamber component subroutines will now be described with reference to FIGS. 1, 2 and 4. The substrate positioning subroutine 80 comprises program code for controlling chamber components that are used to load the substrate 16 onto susceptor 18 and, optionally, to lift the substrate to a desired height in the chamber 12 to control the spacing between the substrate and the gas distribution manifold 14. When a substrate is loaded into the process chamber 12, the susceptor 18 is lowered to receive the substrate, and thereafter, the susceptor 18 is raised to the desired height in the chamber, to maintain the substrate at a first distance or spacing from the gas distribution manifold during the CVD process. In operation, the substrate positioning subroutine 80 controls movement of the susceptor 18 in response to process set parameters related to the support height that are transferred from the chamber manager subroutine 77a.

The process gas control subroutine 83 has program code for controlling process gas composition and flow rates. The process gas control subroutine 83 controls the open/close position of the safety shut-off valves, and also ramps up/down the mass flow controllers to obtain the desired gas flow rate. The process gas control subroutine 83 is invoked by the chamber manager subroutine 77a, as are all chamber component subroutines, and receives from the chamber manager subroutine process parameters related to the desired gas flow rates. Typically, the process gas control subroutine 83 operates by opening the gas supply lines and repeatedly (i) reading the necessary mass flow controllers, (ii) comparing the readings to the desired flow rates received from the chamber manager subroutine 77a, and (iii) adjusting the flow rates of the gas supply lines as necessary. Furthermore, the process gas control subroutine 83 includes steps for monitoring the gas flow rates for unsafe rates and for activating the safety shut-off valves when an unsafe condition is detected.

In some processes, an inert gas such as helium or argon is flowed into the chamber 12 to stabilize the pressure in the chamber before reactive process gases are introduced. For these processes, the process gas control subroutine 83 is programmed to include steps for flowing the inert gas into the chamber 12 for an amount of time necessary to stabilize the pressure in the chamber, and then the steps described above would be carried out.

The pressure control subroutine 85 comprises program code for controlling the pressure in the chamber 12 by regulating the size of the opening of the throttle valve in the exhaust system of the chamber. The size of the opening of the throttle valve is set to control the chamber pressure to the desired level in relation to the total process gas flow, size of the process chamber, and pumping setpoint pressure for the exhaust system. When the pressure control subroutine 85 is invoked, the desired, or target, pressure level is received as a parameter from the chamber manager subroutine 77a. The pressure control subroutine 85 operates to measure the pressure in the chamber 12 by reading one or more conventional pressure manometers connected to the chamber, to compare the measured value(s) to the target pressure, to obtain PID (proportional, integral, and differential) values from a stored pressure table corresponding to the target pressure, and to adjust the throttle valve according to the PID values obtained from the pressure table. Alternatively, the pressure control subroutine 85 can be written to open or close the throttle valve to a particular opening size to regulate the chamber 12 to the desired pressure.

The heater control subroutine 87 comprises program code for controlling the current to a heating unit that is used to heat the substrate 16. The heater control subroutine 87 is also invoked by the chamber manager subroutine 77a and receives a target, or set-point, temperature parameter. The heater control subroutine 87 determines the temperature by measuring the voltage output of a thermocouple located in susceptor 18, comparing the measured temperature to the set-point temperature, and increasing or decreasing current applied to the heating unit to obtain the set-point temperature. The temperature is obtained from the measured voltage by looking up the corresponding temperature in a stored conversion table, or by calculating the temperature using a fourth-order polynomial. When an embedded loop is used to heat the susceptor 18, the heater control subroutine 87 gradually controls a ramp up/down of current applied to the loop. Additionally, a built-in fail-safe mode can be included to detect process safety compliance, and can shut down operation of the heating unit if the process chamber 12 is not properly set up.

In some embodiments, the chamber 12 is outfitted with an RF power supply 48 that is used for chamber cleaning or other operations. When a chamber cleaning plasma process is employed, plasma control subroutine 90 comprises program code for setting the frequency RF power levels applied to the process electrodes in the chamber 12. Similar to the previously described chamber component subroutines, the plasma control subroutine 90 is invoked by the chamber manager subroutine 77a.

The above CVD system description is mainly for illustrative purposes and should not be considered as limiting the scope of the present invention. Variations of the above described system, such as variations of platen or susceptor design, heater design, location of RF power connections and others are possible. The method for depositing a tungsten layer according to the present invention is not limited to any specific processing apparatus.

IV. Microwave Thermal Reflow System

Figure 5:
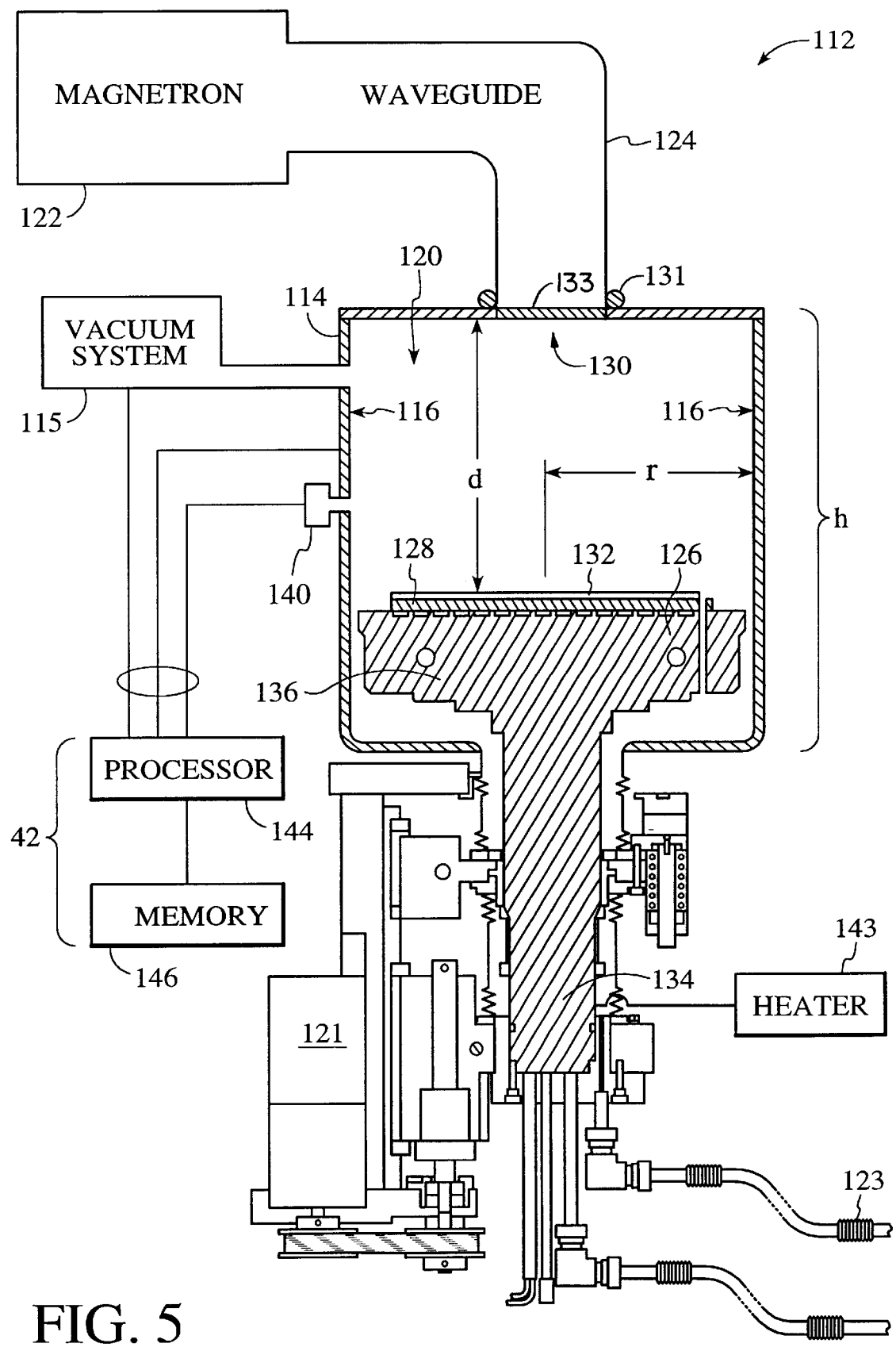
FIG. 5 is a vertical, cross-sectional view of one embodiment of a microwave thermal reflow system, in accord with the present invention.

Referring to FIG. 5, the thermal reflow system 112 includes a reflow chamber 114 having conductive walls 116, defining a high-Q resonant cavity 120. A source of microwave energy, such as a magnetron 122 is in electrical communication with the cavity 120 via a waveguide 124. A susceptor 126 is disposed within the cavity 120 to support a substrate 128, which may be brought into the chamber when the susceptor 126 is positioned adjacent to a slit valve (not shown). The reflow chamber 114 includes an input aperture 130 disposed opposite to the susceptor 126. Microwave energy generated by the magnetron travels through the waveguide 124, which is coupled to the input aperture 130. The waveguide 124 is isolated, fluidly, from the chamber 114 via a microwave window 133 which may be formed from sapphire, aluminum oxide and any other material which is transmissive to microwave energy and imperious to gas molecules. A seal 131 is coupled between the waveguide 124 and the input aperture 130 to maintain fluid-tight integrity of the system 112. The input aperture 130 is positioned on the reflow chamber 114 to allow microwave energy to enter the cavity 120 so that the susceptor 126 is centrally disposed with respect to the electric fields of the microwave energy. The walls 116 typically define a cylindrical cavity 120 having electrically conductive walls with dimensions, such as a height "h" and a radius "r", sufficient to be resonant at a predetermined frequency. The walls may be formed from any conductive material, e.g., aluminum. Preferably, the walls are coated with a conductor such as copper, silver or gold. The magnitude of the dimension "r" is typically dependent upon the size of the substrate 128 to be processed. The remaining dimension "h" is varied to achieve resonance at the proper frequency and mode according to the following:

$$f_{res} = c(1 + [2L/3.41r]^2)^{1/2}/2L$$

where c is the speed of light.

The predetermined frequency is typically determined by both the type and thickness of the metal thin-film layer 132 disposed on the substrate 128. It has been found that the affinity of microwave energy for certain metals allows the same to act as a shield for the substrate 128 underlying the metal thin-film layer 132. At the proper resonant frequency and mode, therefore, the electric fields generated by the microwave energy in the cavity 120 will be absorbed by the metal thin-film layer 132 without being absorbed by the substrate 128. Thus, the heat generated by absorption of the electric fields is focused in the metal thin-film layer 132, leaving the substrate 128 substantially isolated, thermally, from the reflow process. Typically, the resonant frequency is in the range of 1 GHz to 10 GHz.

For example, the thickness of a copper, Cu, thin-film layer disposed on an $SiO_2$ substrate 128 is typically in the range of 1 to 2 micrometers. Forming the cavity 120 to have a resonant frequency approximating 2.45 GHz allows reflowing the copper thin-film layer sufficiently to cover gaps or voids in the substrate 128 have aspect ratios as high a 3:1 in less than 30 seconds, while maintaining the substrate 128 temperature below 350° C. Similar process parameters have been achieved for aluminum metal thin-films having a thickness in the range of 2 to 3 micrometers.

A problem encountered was obtaining the proper resonant frequency in the cavity 120, due to the presence of the susceptor 126. The susceptor 126 is formed from a non-conductive dielectric so that the substrate 128 may be supported at a floating potential and electrically isolated from the remaining components of the chamber 114. This structure ensures that the microwave energy in the cavity 120 may be absorbed by the metal thin-film layer 132. The presence of the dielectric susceptor 126 alters the boundary conditions of the resonant cavity 120. Specifically, the susceptor 126 acts like a cavity resonator, in that it has a resonant frequency that is a function of the susceptor 126's shape and the dielectric constant of the material from which the susceptor 126 is formed. Unlike a cavity resonator, the electromagnetic fields generated by the susceptor 126 propagates throughout the resonant cavity 120. This alters the resonant frequency established by the cavity dimension "h" and "r". The problem presented by the susceptor 126 is exacerbated with increasing size. Thus, achieving the proper resonant frequency for substrates having a large diameter, e.g., 300 mm, the difficulties posed in obtaining the proper resonant frequency is manifest.

To overcome the aforementioned problem, the susceptor 126 is coupled to the cavity 120 so as to be moveably disposed therein, while forming the lower wall thereof. This allows varying the boundary conditions of the electromagnetic fields propagating in the cavity 120. To that end, the susceptor 126 may include a support platform 136 which has a cross-sectional area coextensive with the cross-sectional area of the cavity 120. Extending from the support platform 136, in a direction away from the input aperture 130, is a shaft 134. Although it is preferred that the entire susceptor 126 be formed from a dielectric, the same may be formed so that only the portion of the shaft 134 which is disposed within the cavity 120 consists of dielectric material. The remaining portions of the shaft 134 may be formed from any suitable material in the art, typically aluminum. The susceptor 126 is operably coupled to a motor 121 so that the distance "d" between the input aperture 130 and the susceptor 126 may be varied to tune the cavity 120 to the proper resonant frequency and mode to maximize the amount of microwave energy absorbed by the metal thin-film layer 132. To determine the resonant frequency of the cavity 120, a meter 140 may be in electrical communication therewith at a region located between the input aperture 130 and the support platform 136 to measure the microwave energy reflected from the substrate frequency and mode to maximize the amount of microwave energy absorbed by the metal thin-film layer 132. To determine the resonant frequency of the cavity 120, a meter 140 may be in electrical communication therewith at a region located between the input aperture 130 and the support platform 136 to measure the microwave energy reflected from the substrate 128. Alternatively, a frequency meter may be employed.

Moreover, it was found that microwave energy entering the cavity 120 may be dissipated before heating the substrate 128 due to formation of a plasma therein and/or arcing. It was found that these problems may be avoided by evacuating the reflow chamber 114 to a specified pressure level. Specifically, it was found critical to evacuate the reflow chamber 114, e.g., via a vacuum system 115, so that the established atmospheric pressure therein was not greater than $1 \times 10^{-4}$ torr. At these pressure levels, the amount of microwave energy dissipated, due to plasma formation and arcing, was significantly reduced. However, this results in a deleterious problem of heating the substrate 128.

With the pressure established to be less than $1 \times 10^{-4}$ torr, convection heating of the substrate 128 is minimized. There is a dearth of molecules in the atmosphere disposed in the reflow chamber 114 which can conduct heat away from the metal thin-film layer 132. This results in the metal thin-film layer 132 being thermally isolated from the chamber walls 116. Thus, the substrate 128 may be subjected to rapid heating via thermal conduction with the metal thin-film layer 132. To prevent the aforementioned increase in the substrate 128's temperature, the pressure in the reflow chamber 114 may be rapidly increased to maximize cooling via convection. To that end, the atmosphere in the reflow chamber 114 is typically raised between 1 and 100 torr by introducing gases, such as helium, argon or nitrogen, into the reflow chamber 114 via purge line 123 after the microwave energy has been extinguished. However, it is preferred to raise the chamber 114 pressure to approximately 5 torr, because maximum thermal conduction and throughput is assured at this pressure.

In addition, it was found that the time necessary to reflow the metal thin-film layer 132 may be further reduced by conduction heating of the substrate 128. To that end, a heater 143 may be placed in thermal communication with the temperature. The predetermined temperature may vary depending upon the physical characteristics of the substrate, with 350° C. being a critical temperature for an $SiO_2$ substrate. Thus, the actual reflow time necessitated to satisfy the aforementioned criteria is dependent upon the materials from which the substrate 128 is formed, as well as the materials from which the metal thin-film layer 132 is formed and the thin-film layer 132's thickness. As a result, the reflow time is application dependent and may range from five to sixty seconds.

Although the microwave energy has been described as being generated by the magnetron 122, any microwave generators known in the art may be employed. For example, an inexpensive pulsed, low wattage power supply to generate between about 1–1.5 kW microwave power from the magnetron, or a high wattage, continuous wave (CW) power supply to generate typically up to about 2.5–6 kW microwave power from the magnetron. In some preferred embodiments, the magnetron 122 may be the type of magnetron employed in some microwave ovens and be powered by a low cost, low wattage, pulsed 60 Hertz (Hz) half-rectified power source (which contains large ripples) to provide microwaves having a frequency of about 2.45 Gigahertz (GHz). Such pulsed, low wattage microwave generators can be at least two orders of magnitude lower in price than a high power CW microwave generator or an RF generator. Similarly the waveguide 124 may be any type known in the art, and may be made of aluminum, copper, stainless steel, and the like. The dimensions of the waveguide are that needed to merely transmit microwave energy to plasma cavity 120 without selectively guiding particular modes. To that end, the volume of the waveguide 124 is shown as having a rectangular cross-section in two orthogonal planes, both of which extend parallel to flow path a. The dimensions of the walls 124a, 124b, 124c and 124d, are selected so that the volume has dimensions, e.g., length ($l_{AP}$), width ($W_{AP}$) and height ($h_{AP}$), necessary to achieve the desired resonance mode of the microwave energy. Preferably the dimensions of the waveguide 124's volume are established to obtain one of the $TE_{10n}$ resonance modes, where n is an integer, as well as minimize the microwave energy reflected.

As with the deposition system 13, the activities of the reflow system 112 may be regulated with a system controller 142 executing system control software in the form of a computer program stored in a computer-readable medium. Typically, the system controller 142 consists of a single-board computer (SBC) including a processor 144 and a memory 146, as well as analog and digital input/output boards, interface boards and stepper motor controller boards. Various parts of thermal reflow system 112 conform to the Versa Modular European (VME) standard which defines board, card cage, and connector dimensions and types. The VME standard also defines the bus structure as having a 16-bit data bus and a 24-bit address bus. Preferably, memory 146 is a hard disk drive, but memory 146 may also be other kinds of memory. The computer program includes sets of instructions that dictate the timing, mixture of gases, chamber pressure, chamber temperature, RF power levels, susceptor position, and other parameters of a particular process. Other computer programs stored on other memory devices including, for example, a floppy disk or other another appropriate drive, may also be used to operate the system controller 142.

The process for depositing the film can be implemented using a computer program product that is executed by the processor 144. The computer program code can be written in any conventional computer readable programming language: for example, 68000 assembly language, C, C++, Pascal, Fortran or others. Suitable program code is entered into a single file, or multiple files, using a conventional text editor, and stored or embodied in a computer usable medium, such as a memory system of the computer. If the entered code text is in a high level language, the code is compiled, and the resultant compiler code is then linked with an object code of precompiled Windows™ library routines. To execute the linked, compiled object code the system user invokes the object code, causing the computer system to load the code in memory. The CPU then reads and executes the code to perform the tasks identified in the program.

Figure 7:
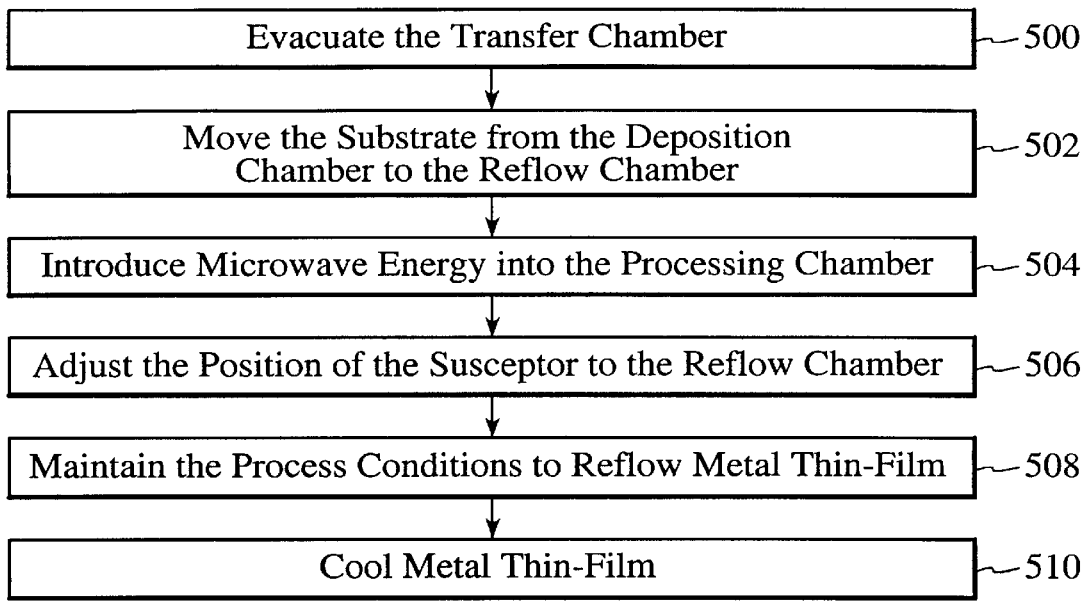
FIG. 7 is a flowchart illustrating the steps of a method employed using the system shown in FIG. 5, in accord with the present invention.

For example, referring to FIGS. 1, 5 and 7, to perform the thermal reflow method, the processor 144 would execute program code at step 500 to evacuate the transfer chamber 15. At step 502, the substrate 128 would be removed from the deposition chamber 12 to reflow chamber 114. At step 504, microwave energy, having a predetermined frequency, would be introduced into the reflow chamber 114. Thereafter, at step 506, the distance between the substrate 128 and the input aperture 130 would be adjusted to maximize absorption of the microwave energy by the metal thin-film 132. At step 508, the process conditions, proximate to the surface of the substrate, would be maintained for a predetermined amount of time to allow the metal thin-film to reflow over the surface. At step 510, the metal thin-film 132 is cooled via pressurizing the reflow chamber 114, as discussed above.

Figure 8:
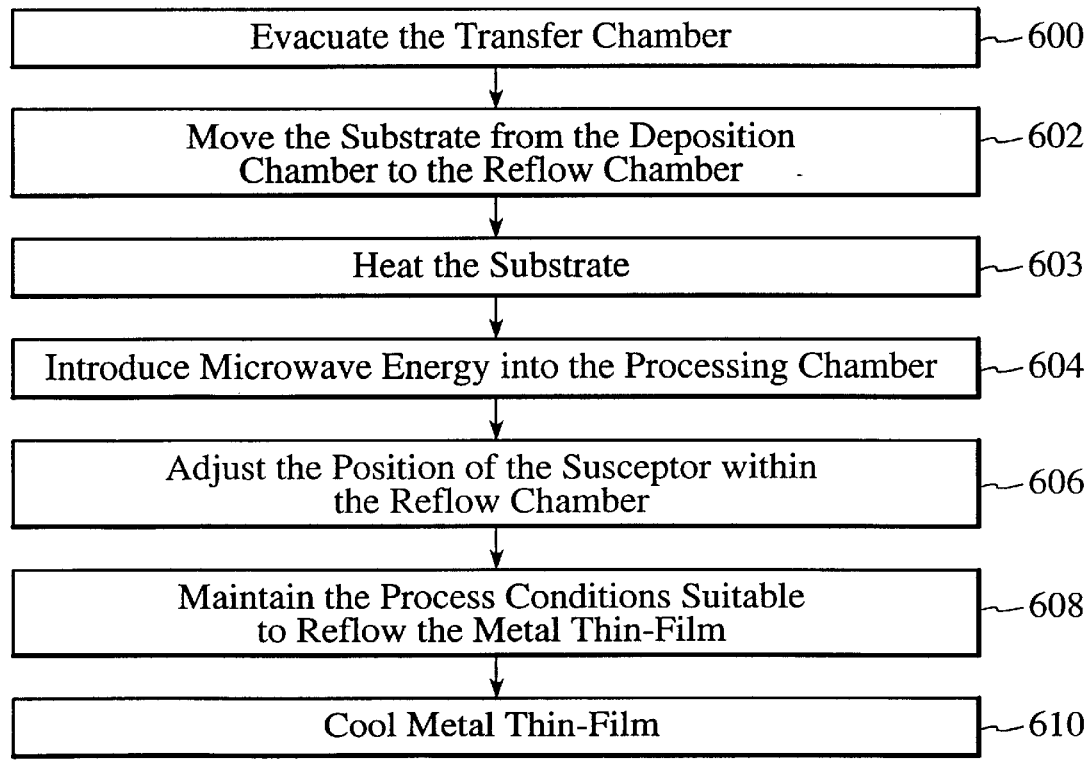
FIG. 8 is a flowchart illustrating the steps of a method employed using the system shown in FIG. 5, in accord with a alternate embodiment of the present invention.

Referring to FIG. 8, an alternative embodiment for performing the thermal reflow method discussed above with respect to FIG. 7 is shown. The method shown in FIG. 8 is identical to the method shown in FIG. 7 except that an additional step is provided in which the substrate is heated. As shown in FIG. 8, at step 600 the transfer chamber 15, shown in FIG. 1, is evacuated. At step 602, the substrate 128 is moved from the deposition chamber 12 to the reflow chamber 114. Following step 602, the substrate is heated, at step 603. Either concurrently with, or following step 603, microwave energy, having a predetermined frequency, would be introduced into the reflow chamber 114 at step 604. Thereafter, at step 606, the distance between the substrate 128 and the input aperture 130 would be adjusted to maximize absorption of the microwave energy by the metal thin-film 132. At step 608, the process conditions, proximate to the surface of the substrate, would be maintained for a predetermined amount of time to allow the metal thin-film to reflow over the surface. At step 610, the metal thin-film 132 is cooled via pressurizing the reflow chamber 114, as discussed above.

What is claimed is:

1. A method for processing a substrate having a metal thin-film disposed upon a surface thereof, said substrate being seated upon a susceptor in a reflow chamber having electrically conductive walls, said method comprising the steps of:
    introducing, into said reflow chamber, microwave energy having a predetermined frequency at a region disposed opposite to said substrate;
    isolating, electromagnetically, said susceptor from said chamber walls;
    adjusting a distance between said substrate and said region by moving said substrate relative to said region; and
    maintaining process conditions, proximate to said surface, for a predetermined amount of time to allow said metal thin-film to reflow over said surface.

2. The method as recited in claim 1 further including a step of heating said susceptor to heat the metal thin-film on the substrate.

3. The method as recited in claim 1 wherein said surface is a stepped surface defining a plurality of recessed areas therein, and said maintaining step includes maintaining process conditions suitable to allow said metal thin-film to fill a substantial portion of each of said plurality of recessed areas.

4. The method as recited in claim 1 wherein said microwave energy has a frequency in the range of 1 to 10 GHz.

5. The method as recited in claim 1 wherein said predetermined amount of time is in the range of 5 to 60 seconds.

6. The method as recited in claim 1 wherein said process conditions include increasing a temperature of said metal thin-film independent of a temperature of said substrate.

7. The method as recited in claim 1 further including the step of evacuating said chamber, before said introducing step.

8. The method as recited in claim 7 wherein said chamber is evacuated sufficiently to prevent plasma formation therein.

9. The method as recited in claim 8 further including a step of pressurizing said chamber, subsequent to an expiration of said predetermined amount of time, to a preset pressure level.

10. A method for processing a substrate in a multi-chamber vacuum processing system having first and second processing chambers, said second processing chamber having a input aperture, with said method comprising the steps of:
    placing said substrate in a deposition zone of said first processing chamber;

introducing into said deposition zone, a process gas suitable for depositing a metal thin-film layer on said substrate;

moving, under vacuum, said substrate between said first and second processing chambers;

placing said substrate on a susceptor in said second processing chamber;

introducing, into said second processing chamber, microwave energy having a predetermined frequency at a region disposed opposite to said substrate;

isolating, electromagnetically, said susceptor from said chamber walls;

adjusting a distance between said substrate and said region to vary absorption of said microwave energy by said metal thin-film layer; and maintaining process conditions, proximate to said surface, for a predetermined amount of time to generate heat in said metal thin-film sufficient to reflow said thin-film over said surface.

11. The method as recited in claim 10 further including, subsequent to said step of placing said substrate in said second processing chamber, a step of evacuating said second processing chamber sufficiently to reduce thermal energy transfer, between said metal thin-film and said substrate, by convection.

12. The method as recited in claim 10 further including the step of evacuating said second processing chamber, subsequent to said step of placing said substrate therein.

13. The method as recited in claim 11 further including the step of pressurizing said second processing chamber, subsequent to an expiration of said predetermined amount of time, to a preset pressure level to reduce thermal transfer between said metal thin-film and said substrate by convection.

14. The method as recited in claim 10 wherein the distance between said substrate and said region is adjusted to maximize absorption of said microwave energy by said metal thin-film layer.

15. The method as recited in claim 14 further including a step of heating said susceptor to heat the metal thin-film on the substrate.

16. The method as recited in claim 12 wherein said second processing chamber is evacuated sufficiently to prevent arcing therein.

17. The method as recited in claim 10 wherein said surface is a stepped surface defining a plurality of recessed areas therein, and said maintaining step includes maintaining process conditions suitable to allow said metal thin-film to fill a substantial portion of each of said plurality of recessed areas.

18. The method as recited in claim 17 wherein said microwave energy has a frequency in the range of 1 to 10 GHz.

19. The method as recited in claim 1 wherein the distance between said substrate and said region is adjusted to maximize absorption of said microwave energy by said metal thin-film.

20. The method as recited in claim 9 wherein said preset pressure level is set to facilitate dissipation of heat generated during reflow of said metal thin-film.

21. The method as recited in claim 7 wherein said chamber is evacuated sufficiently to prevent arcing therein.

22. The method as recited in claim 12 wherein said second processing chamber is evacuated sufficiently to prevent plasma formation therein.

23. A method for processing a substrate having a metal thin-film disposed upon a surface thereof, said substrate being disposed in a reflow chamber, said method comprising:

introducing, into said reflow chamber, microwave energy at a region disposed opposite to said substrate;

adjusting a distance between said substrate and said region without changing the size of said reflow chamber to vary absorption of said microwave energy by said metal thin-film; and maintaining process conditions in said reflow chamber to allow said metal thin-film to reflow over said surface.

24. The method as recited in claim 23 wherein the distance between said substrate and said region is adjusted to maximize absorption of said microwave energy by said metal thin-film.

* * * * *